US012469638B2

(12) United States Patent
Oota et al.

(10) Patent No.: US 12,469,638 B2
(45) Date of Patent: Nov. 11, 2025

(54) METHOD OF MANUFACTURING AN INDUCTOR COMPONENT (71) Applicant: Murata Manufacturing Co., Ltd., Kyoto-fu (JP)

(72) Inventors: Yoshiyuki Oota, Nagaokakyo (JP); Tomohiro Kido, Nagaokakyo (JP); Tomonori Sakata, Nagaokakyo (JP); Masahiro Kubota, Nagaokakyo (JP); Kenta Kondo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 18/521,878

(22) Filed: Nov. 28, 2023

(65) Prior Publication Data
US 2024/0096551 A1  Mar. 21, 2024

Related U.S. Application Data (62) Division of application No. 16/129,703, filed on Sep. 12, 2018, now Pat. No. 11,869,708.

(30) Foreign Application Priority Data

Sep. 20, 2017  (JP) ................. 2017-180459

(51) Int. Cl.
H01F 27/28  (2006.01)
H01F 17/00  (2006.01)
(Continued)

(52) U.S. Cl.
CPC ....... *H01F 41/041* (2013.01); *H01F 17/0013* (2013.01); *H05K 3/12* (2013.01); *H01F 2027/2809* (2013.01)

(58) Field of Classification Search
CPC ............... H01F 41/041; H01F 17/0013; H01F 2027/2809; H01F 27/2804; H01F 27/32; H01F 2017/002; H05K 3/12
See application file for complete search history.

(56) References Cited

U.S. PATENT DOCUMENTS 6,365,265 B1  4/2002  Tose et al.
6,366,304 B1  4/2002  Nakayasu et al.
(Continued)

FOREIGN PATENT DOCUMENTS

CN  104103398 A  10/2014
CN  108025956 A  5/2018
(Continued)

OTHER PUBLICATIONS

An Office Action; "Notification of Reasons for Refusal," Mailed by the Japanese Patent Office on Nov. 26, 2019, which corresponds to Japanese Patent Application No. 2017-180459 and is related to U.S. Appl. No. 16/129,703; with English language translation.
(Continued)

*Primary Examiner* — Tuyen T Nguyen
(74) *Attorney, Agent, or Firm* — Studebaker Brackett PLLC (57) ABSTRACT A method of manufacturing an inductor component includes preparing an insulating paste that is photosensitive and that includes a filler material composed of quartz, a glass material and a resin material, and a conductive paste, forming a first insulating layer by applying the insulating paste, and exposing the first insulating layer in a state where a first portion of the first insulating layer is shielded by a mask. The method further includes removing the first portion of the first insulating layer to form a groove at a position corresponding to the first portion, applying the conductive paste in the groove to form a coil conductor layer in the groove, and
(Continued)

applying the insulating paste on the first insulating layer and the coil conductor layer to form a second insulating layer.

4 Claims, 7 Drawing Sheets

(51) Int. Cl.
*H01F 41/04* (2006.01)
*H05K 3/12* (2006.01)

(56) References Cited

U.S. PATENT DOCUMENTS

| | | | |
|---|---|---|---|
| 6,555,913 B1 | 4/2003 | Sasaki et al. | |
| 6,911,887 B1* | 6/2005 | Uriu | H01F 41/041 336/200 |
| 7,859,002 B2 | 12/2010 | Nagai et al. | |
| 8,112,880 B2 | 2/2012 | Zhang et al. | |
| 10,390,427 B2 | 8/2019 | Kanbara | |
| 10,416,557 B2 | 9/2019 | Soga et al. | |
| 10,490,338 B2 | 11/2019 | Sano et al. | |
| 10,840,009 B2 | 11/2020 | Kido | |
| 2003/0038372 A1 | 2/2003 | Sasaki et al. | |
| 2008/0048813 A1* | 2/2008 | Mosley | H01F 41/041 336/65 |
| 2008/0090372 A1 | 4/2008 | Jeong | |
| 2008/0318061 A1 | 12/2008 | Inaba et al. | |
| 2014/0118100 A1* | 5/2014 | Sato | H01F 17/0013 336/200 |
| 2014/0306792 A1* | 10/2014 | Yoneda | H01F 17/0013 336/200 |
| 2014/0356637 A1 | 12/2014 | Lee | |
| 2018/0090266 A1* | 3/2018 | Sano | H01F 27/292 |
| 2018/0220529 A1 | 8/2018 | Kanbara | |

FOREIGN PATENT DOCUMENTS

| | | |
|---|---|---|
| JP | H07-130543 A | 5/1995 |
| JP | 2000040633 A | 2/2000 |
| JP | 2002-148786 A | 5/2002 |
| JP | 2014038145 A | 2/2014 |
| JP | 2014-207280 A | 10/2014 |
| WO | 2017056793 A1 | 4/2017 |

OTHER PUBLICATIONS

An Office Action issued by the China National Intellectual Property Administration on Aug. 28, 2020, which corresponds to Chinese Application No. 201811086893.3 and is related to U.S. Appl. No. 16/129,703 with English language translation.

An Office Action; "Notice of Reasons for Refusal," mailed by the Japanese Patent Office on Jun. 22, 2021, which corresponds to Japanese Patent Application No. 2020-141919 and is related to U.S. Appl. No. 16/129,703 with English language translation.

\* cited by examiner

METHOD OF MANUFACTURING AN INDUCTOR COMPONENT

CROSS-REFERENCE TO RELATED APPLICATION

This application is a Divisional of U.S. patent application Ser. No. 16/129,703, filed Sep. 12, 2018, which claims benefit of priority to Japanese Patent Application No. 2017-180459, filed Sep. 20, 2017, the entire content of which is incorporated herein by reference.

BACKGROUND

Technical Field

The present disclosure relates to an inductor component and a method of manufacturing the inductor component.

Background Art

To date, an inductor component is described in Japanese Unexamined Patent Application Publication No. 2014-207280. The inductor component includes an element body including a glass material and a coil provided in the element body. The element body includes a plurality of insulating layers. The coil includes coil conductor layers wound on flat surfaces on the insulating layers.

In the existing inductor component, because the aspect ratio of each of the coil conductor layers is small, it has not been possible to increase the cross-sectional area of the coil conductor layer and it has not been possible to increase the current flowing through the coil. Therefore, in order to increase the aspect ratio, two coil conductor layers have been brought into surface contact with each other.

However, by bringing two coil conductor layers into surface contact with each other, a plurality of protrusions are formed on the side surfaces of the two coil conductor layers which are in surface contact with each other, and the coil characteristics deteriorate due to the plurality of protrusions.

The inventors of the present disclosure have focused on increasing the aspect ratio of the coil conductor layer by forming a groove so as to be deep because, in the existing method of manufacturing an inductor component, a groove is formed in the insulating layer by a photolithographic process and the coil conductor layer is formed in this groove. However, the inventors of the present disclosure have found that the following problems exist in the existing manufacturing method. That is, in addition to a glass material, the insulating layer contains a filler material composed of alumina in order to secure strength. Because alumina contained in the filler material has a high refractive index, when a groove is formed by exposing a negative photosensitive insulating layer to light, the light used for exposure scatters in the insulating layer and it is not possible to radiate light to a deeper portion in the insulating layer. For this reason, the groove becomes shallow, making it difficult to form a coil conductor layer having a large aspect ratio.

SUMMARY

Accordingly the present disclosure provides an inductor component capable of improving coil characteristics and a method of manufacturing the inductor component.

A method of manufacturing an inductor component according to a preferred embodiment of the present disclosure includes a step of preparing an insulating paste that is photosensitive and that includes a filler material composed of quartz, a glass material and a resin material, and a conductive paste, and a step of forming a first insulating layer by applying the insulating paste, a step of exposing the first insulating layer in a state where a first portion of the first insulating layer is shielded by a mask. The method further includes a step of removing the first portion of the first insulating layer to form a groove at a position corresponding to the first portion, a step of applying the conductive paste in the groove to form a coil conductor layer in the groove, and a step of applying the insulating paste on the first insulating layer and the coil conductor layer to form a second insulating layer.

In the method of manufacturing an inductor component according to a preferred embodiment of the present disclosure, because an insulating paste containing a filler material composed of quartz and a glass material is used, it is possible to approximate the refractive indexes of the filler material and the glass material to each other. Consequently, when grooves are formed in the first insulating layer by exposure to light, scattering of the light used for exposure in the first insulating layer can be prevented, and light can be radiated to a deeper portion in the first insulating layer. As a result, the aspect ratio of the coil conductor layer can be increased and the cross-sectional area of the coil conductor layer can be increased. Therefore, because it is not necessary to stack a plurality of coil conductor layers in surface contact with each other and the shape of the side surface of the coil conductor layer can be formed smoothly, the Q value can be further increased and the coil characteristics can be improved.

In addition, in the method of manufacturing an inductor component according to a preferred embodiment of the present disclosure, in the step of exposing the first insulating layer, exposure may be performed with light not including a wave length of about 350 nm or less. Accordingly, because exposure is performed with light not including a wave length of about 350 nm or less, it is possible to cut a short wave length that easily scatters and to form a deep groove more reliably.

In addition, in the method of manufacturing an inductor component according to a preferred embodiment of the present disclosure, after the step of forming the second insulating layer, firing may be performed at a temperature of about 800° C. or more and about 1000° C. or less (i.e., from about 800° C. to about 1000° C.). Accordingly, because the firing is performed at a temperature of about 800° C. or more and about 1000° C. or less (i.e., from about 800° C. to about 1000° C.) after the step of forming the second insulating layer, it is possible to perform firing in which the glass material melts and the filler material does not melt.

In addition, in the method of manufacturing an inductor component according to a preferred embodiment of the present disclosure, in the step of preparing the insulating paste and the conductive paste, the content ratio of the filler material to the glass material may be about 20 vol % or more and about 50 vol % or less (i.e., from about 20 vol % or more to about 50 vol %). Accordingly, because the content of the filler material to the glass material is about 20 vol % or more and about 50 vol % or less (i.e., from about 20 vol % or more to about 50 vol %), a high aspect ratio and sinterability can be satisfied.

In addition, an inductor component according to a preferred embodiment of the present disclosure includes an element body formed by stacking a plurality of insulating layers, and a coil provided in the element body. The insulating layers include a filler material composed of quartz and a glass material, the coil includes a coil conductor layer wound on each of the insulating layers, an aspect ratio of the coil conductor layer is about 1.0 or more, and a side surface of the coil conductor layer has one protrusion or is smooth in a cross section perpendicular to the direction in which the coil conductor layer extends.

The aspect ratio of the coil conductor layer is (the thickness of the coil conductor layer in the coil axis direction)/(the width of the coil conductor layer). Further, the coil axis direction refers to a direction parallel to a spiral central axis around which the coil is wound. In addition, the width of the coil conductor layer refers to the width in a direction perpendicular to the coil axis direction in a cross section perpendicular to the direction in which the coil conductor layer extends.

In the inductor component according to a preferred embodiment of the present disclosure, the aspect ratio of the coil conductor layer can be increased, the shape of the side surface of the coil conductor layer can be smoothly formed, and the coil characteristics can be improved.

In addition, in the inductor component according to a preferred embodiment of the present disclosure, the aspect ratio of the coil conductor layer may be about 2.0 or less. Accordingly, because the aspect ratio of the coil conductor layer is about 2.0 or less, a coil conductor layer having a high aspect ratio can be stably formed.

In addition, in the inductor component according to a preferred embodiment of the present disclosure, in the cross section, the coil conductor layer may include a body portion and a head portion connected to the body portion, the width of the head portion may be larger than the width of the body portion, and the thickness of a portion of the head portion may be smaller than the thickness of the body portion.

Accordingly, the end portion in the width direction of the head portion constitutes a protrusion, but because the thickness of the head portion is small, deterioration of coil characteristics can be prevented. The opening of the mask can be enlarged for exposure so that the head portion of the coil conductor layer is formed and the coil conductor layer can be reliably formed even if exposure deviation occurs.

In the inductor component and the method of manufacturing the inductor component according to preferred embodiments of the present disclosure, the coil characteristics can be improved.

Other features, elements, characteristics and advantages of the present disclosure will become more apparent from the following detailed description of preferred embodiments of the present disclosure with reference to the attached drawings.

DETAILED DESCRIPTION

Hereinafter, the present disclosure will be described in detail with reference to the illustrated embodiments.

First Embodiment

Figure 1:
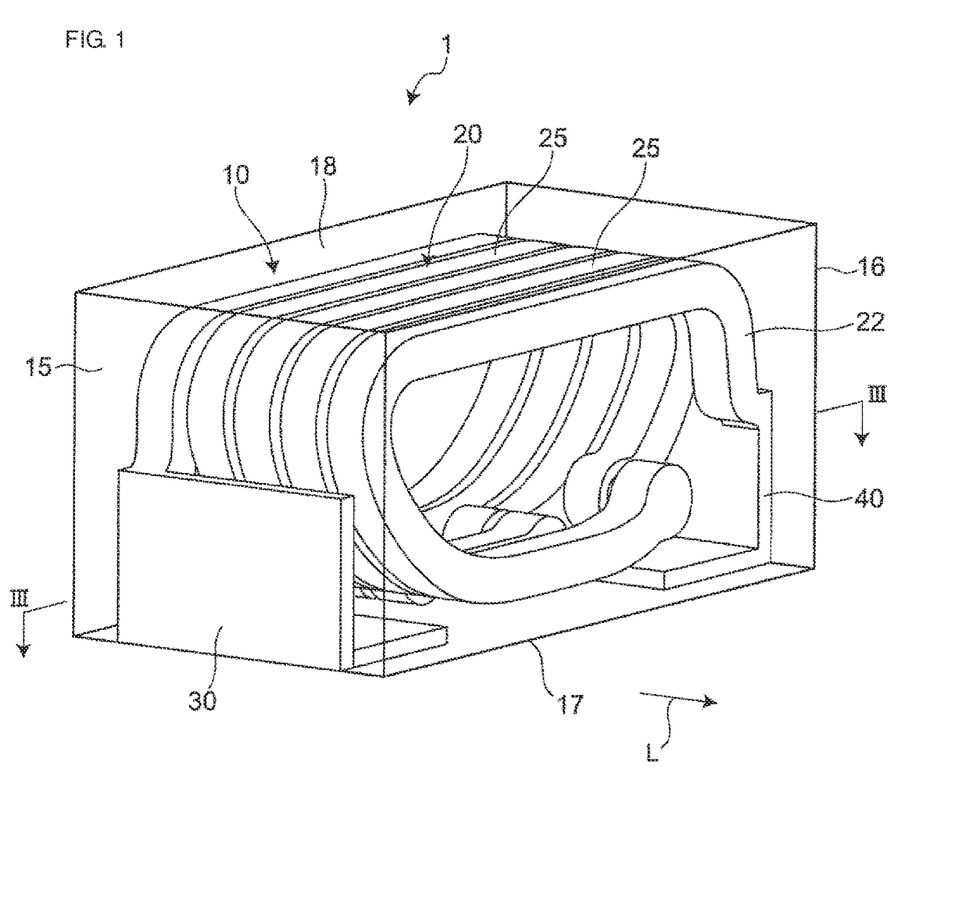
FIG. 1 is a perspective view illustrating an inductor component according to a first embodiment of the present disclosure.
Figure 2:
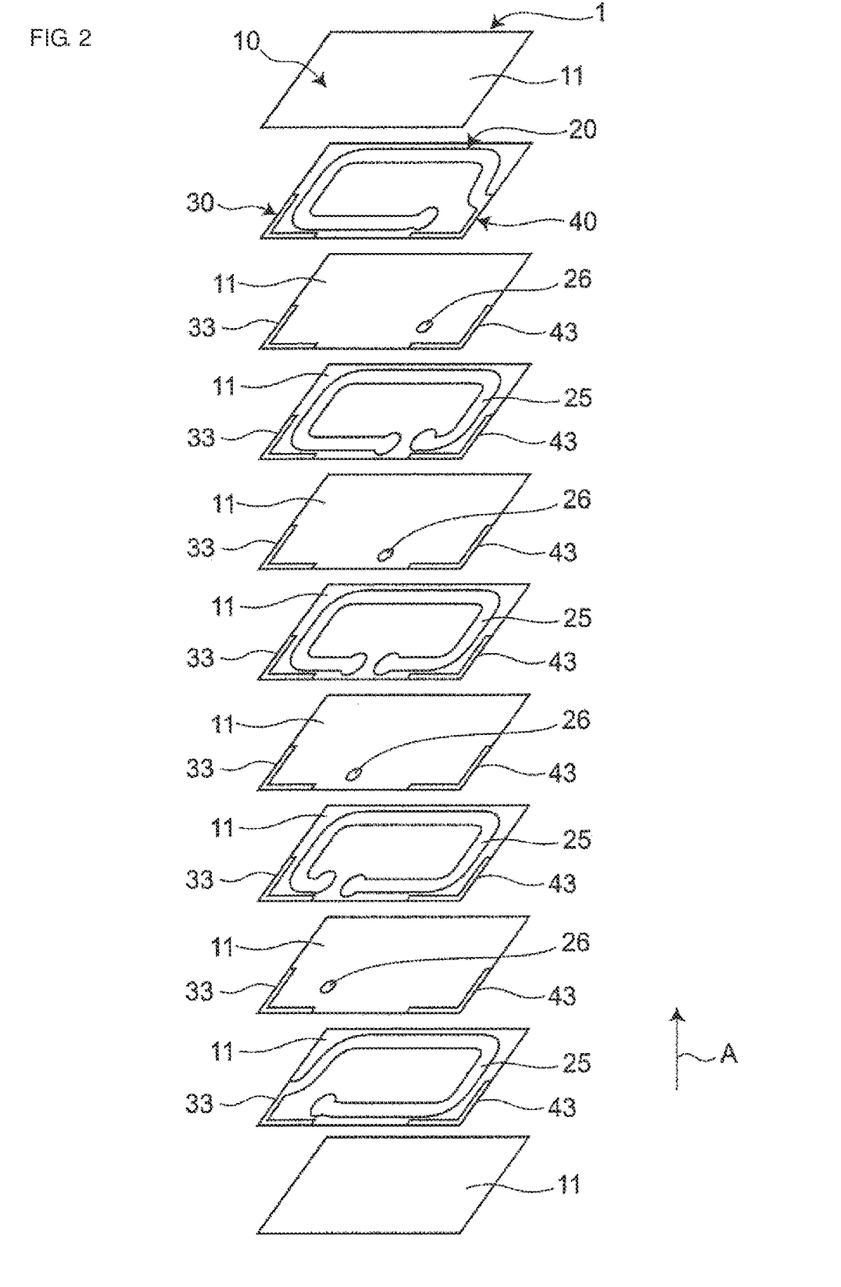
FIG. 2 is an exploded perspective view of the inductor component.
Figure 3:
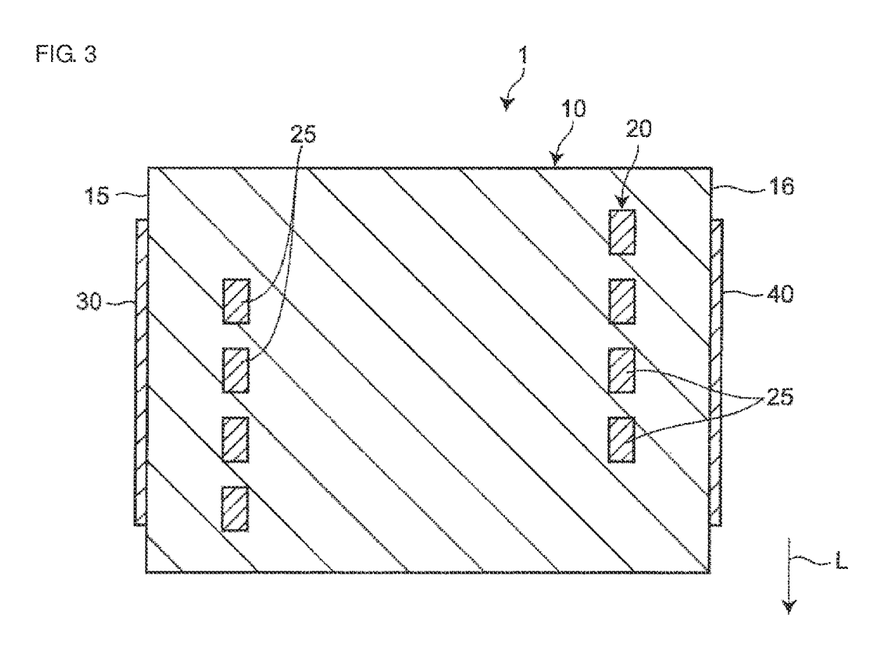
FIG. 3 is a cross-sectional view of the inductor component.

FIG. 1 is a perspective view illustrating an inductor component according to a first embodiment of the present disclosure. FIG. 2 is an exploded perspective view of the inductor component. FIG. 3 is a cross-sectional view of the inductor component. As illustrated in FIG. 1, FIG. 2 and FIG. 3, an inductor component 1 includes an element body 10, a coil 20 that is substantially spiral-shaped and provided inside the element body 10, and a first outer electrode 30 and a second outer electrode 40 that are provided in the element body 10 and electrically connected to the coil 20. In FIG. 1, the element body 10 is drawn clearly so that the structure can be easily understood. FIG. 3 is a cross-sectional view taken along line III-III of FIG. 1.

The inductor component 1 is electrically connected to wiring of a circuit board (not illustrated) via the first outer electrode 30 and the second outer electrode 40. For example, the inductor component 1 is used as an impedance matching coil (matching coil) of a high-frequency circuit, and is used in electronic devices such as personal computers, DVD players, digital cameras, TVs, cellular phones, car electronics, and medical and industrial machines. However, the application of the inductor component 1 is not limited to this, and, for example, it can also be used in a tuning circuit, a filter circuit, a rectification smoothing circuit, or the like.

The element body 10 is formed by stacking a plurality of insulating layers 11. The element body 10 is formed in a substantially rectangular parallelepiped shape. The surfaces of the element body 10 include a first end surface 15, a second end surface 16 that opposes the first end surface 15, a bottom surface 17 connected between the first end surface 15 and the second end surface 16, and a top surface 18 that opposes the bottom surface 17. The first end surface 15, the second end surface 16, the bottom surface 17 and the top surface 18 are surfaces parallel to the stacking direction A of the insulating layers 11. The term "parallel" in the present application is not limited to a strictly parallel relationship, but also includes a substantially parallel relationship in consideration of a practical range of variation. Further, in the element body 10, the interfaces between the plurality of insulating layers 11 in some cases may not be clear due to firing or the like.

The insulating layers 11 include a filler material composed of quartz and a glass material. The quartz is crystal quartz, and the degree of crystallinity of the quartz is not particularly limited. The glass material is borosilicate glass. Further, besides borosilicate glass, for example, glass containing $SiO_2$, $B_2O_3$, $K_2O$, $Li_2O$, $CaO$, $ZnO$, $Bi_2O_3$, and/or $Al_2O_3$, or the like, for example, $SiO_2$—$B_2O_3$—$K_2O$ type glass, $SiO_2$—$B_2O_3$—$Li_2O$—$CaO$ type glass, $SiO_2$—

$B_2O_3$—$Li_2O$—$CaO$—$ZnO$ type glass, and $Bi_2O_3$—$B_2O_3$—$SiO_2$—$Al_2O_3$ type glass may be used as a glass material. Two or more of these inorganic components may be combined.

The first outer electrode 30 and the second outer electrode 40 are formed of, for example, a conductive material such as Ag or Cu and glass particles. The first outer electrode 30 has a substantially L shape provided across the first end surface 15 and the bottom surface 17. The second outer electrode 40 has a substantially L shape provided across the second end surface 16 and the bottom surface 17.

The coil 20 is formed of, for example, a similar conductive material and glass particles to those of the first outer electrode 30 and the second outer electrode 40. The coil 20 is spirally wound along the stacking direction A of the insulating layers 11. A first end of the coil 20 is connected to the first outer electrode 30, and a second end of the coil 20 is connected to the second outer electrode 40. Further, in the present embodiment, the coil 20 and the first outer electrode 30 and the second outer electrode 40 are integrated, and there are no clear boundaries, but the present disclosure is not limited to this, and the coil and the outer electrodes may be formed of different materials or by different methods so that boundaries may be present.

The coil 20 is formed in a substantially oval shape when viewed from the axial direction L, but is not limited to this shape. The shape of the coil 20 may be, for example, a circle, an ellipse, a rectangle, another polygon, or the like. The axial direction L of the coil 20 refers to a direction parallel to a spiral central axis around which the coil 20 is wound. The axial direction L of the coil 20 and the stacking direction A of the insulating layers 11 are the same direction.

The coil 20 includes a plurality of coil conductor layers 25 wound on the insulating layers 11, respectively. The coil conductor layers 25 adjacent to each other in the stacking direction A are electrically connected in series via a via conductor layer 26 that penetrates the insulating layer 11 in the thickness direction. In this way, the plurality of the coil conductor layers 25 form a spiral while being electrically connected in series with each other. Specifically, the coil 20 has a configuration in which a plurality of the coil conductor layers 25, which are electrically connected in series with each other and whose number of windings is less than one turn, are stacked, and the coil 20 has a substantially helical shape.

Figure 4:
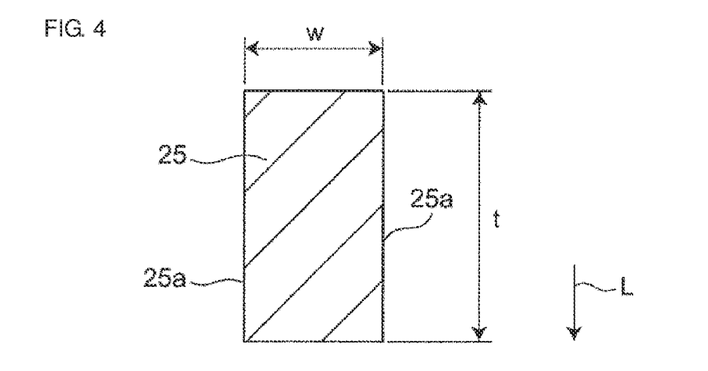
FIG. 4 is a cross-sectional view of a coil conductor layer.

As illustrated in FIG. 4, the aspect ratio of each of the coil conductor layers 25 is about 1.0 or more. The aspect ratio of the coil conductor layer 25 is (thickness t of the coil conductor layer 25 in the axial direction L)/(width w of the coil conductor layer 25). The width w of the coil conductor layer 25 refers to a width in a direction perpendicular to the axial direction L of the coil 20 in a cross section perpendicular to the direction in which the coil conductor layer 25 extends. The thickness t of the coil conductor layer 25 is, for example, about 50 µm, and the width w of the coil conductor layer 25 is, for example, about 25 µm.

In FIG. 4, the cross section of the coil conductor layer 25 has a substantially rectangular shape, but there are cases in which the coil conductor layer 25 in actuality does not have a rectangular shape. Even in this case, the aspect ratio of the coil conductor layer 25 can be calculated from the cross-sectional area of the coil conductor layer 25 and the maximum thickness in the axial direction of the coil conductor layer 25. Specifically, the thickness t is the maximum thickness in the axial direction L of the coil conductor layer 25, the width w may be a value obtained by dividing the cross-sectional area of the coil conductor layer 25 by the maximum thickness of the coil conductor layer 25. Consequently, even if irregularities are formed on the inner surface and outer surface of the coil conductor layer 25, the aspect ratio can be easily obtained. As described above, the cross-sectional shape of the coil conductor layer 25 is not limited to a rectangular shape, but may be an elliptical shape, a polygonal shape, or an uneven variation of these shapes.

As illustrated in FIG. 4, in the cross section perpendicular to the direction in which the coil conductor layer 25 extends, side surfaces 25a of the coil conductor layer 25 are smooth. The side surfaces 25a of the coil conductor layer 25 are positioned on both sides in the width direction and extend in the axial direction. "Smooth" refers to a state without protrusions and includes not only flat surfaces but curved surfaces too.

According to the inductor component 1, the aspect ratio of the coil conductor layer 25 can be increased, the shape of the side surfaces 25a of the coil conductor layer 25 can be smoothly formed, and the coil characteristics can be improved. In contrast, to date, in order to form the same aspect ratio, it has been necessary to stack a plurality of coil conductor layers in surface contact with each other and consequently a plurality of protrusions are formed on the side surfaces of the plurality of coil conductor layers; as a result, the coil characteristics deteriorate.

The aspect ratio of the coil conductor layer 25 of the inductor component 1 is preferably about 2.0 or less. Therefore, it is possible to stably form the coil conductor layer 25 having a high aspect ratio.

Next, a method of manufacturing the inductor component 1 will be described.

First, a negative photosensitive insulating paste and a conductive paste are prepared. The insulating paste includes a filler material composed of quartz, a glass material, and a resin material.

Figure 5A:
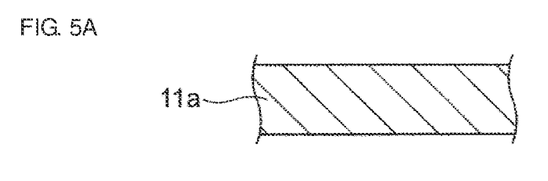
FIG. 5A is an explanatory diagram illustrating a method of manufacturing the inductor component.

As illustrated in FIG. 5A, the insulating paste is applied to form an outer insulating layer 11a. The insulating paste is applied to the outer insulating layer 11a to form a first insulating layer 11b. The insulating paste is applied, for example, by screen-printing.

Figure 5B:
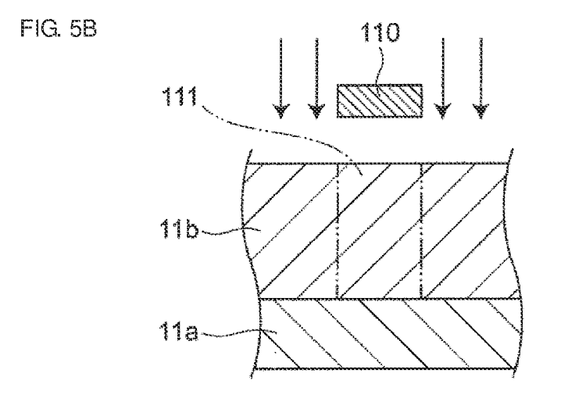
FIG. 5B is an explanatory diagram illustrating the method of manufacturing the inductor component.
Figure 5C:
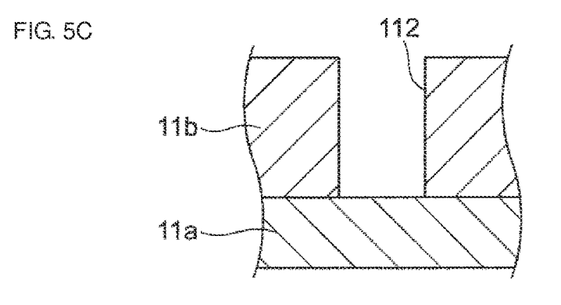
FIG. 5C is an explanatory diagram illustrating the method of manufacturing the inductor component.

As illustrated in FIG. 5B, the first insulating layer 11b is exposed in a state where a first portion 111 (indicated by a two-dot chain line) of the first insulating layer 11b is shielded by a mask 110. As illustrated in FIG. 5C, the first portion 111 of the first insulating layer 11b is removed by developing to form a groove 112 at a position corresponding to the first portion 111.

Figure 5D:
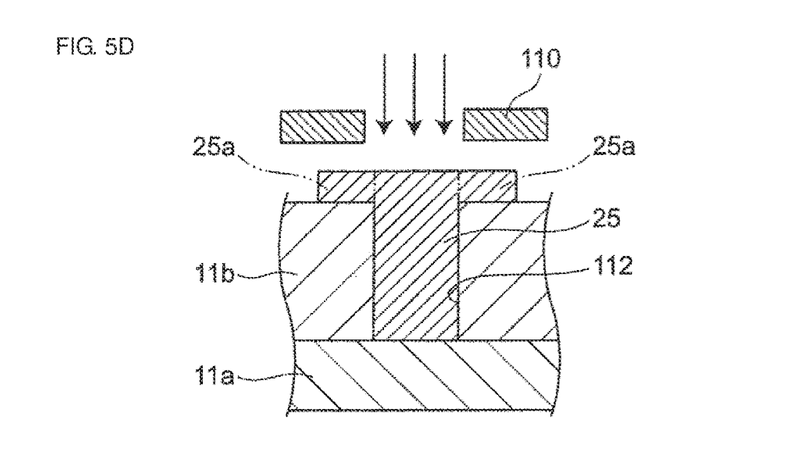
FIG. 5D is an explanatory diagram illustrating the method of manufacturing the inductor component.
Figure 5E:
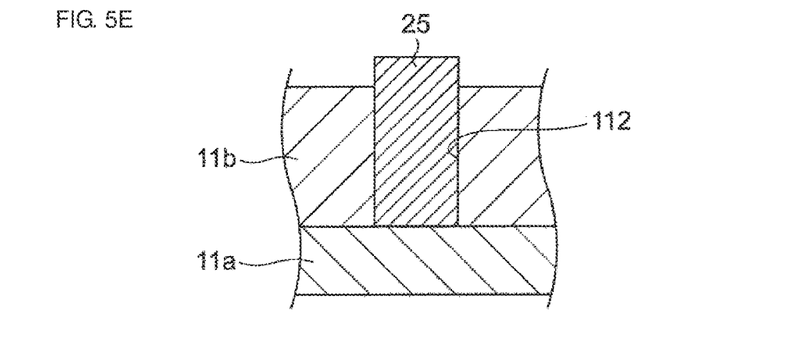
FIG. 5E is an explanatory diagram illustrating the method of manufacturing the inductor component.

As illustrated in FIG. 5D, a conductive paste is applied in the groove 112 to form the coil conductor layer 25 in the groove 112 as illustrated in FIG. 5E. Specifically, as illustrated in FIG. 5D, a photosensitive conductive paste is applied on the first insulating layer 11b and in the groove 112 by screen-printing. At this time, the width of the upper portion of the coil conductor layer 25 is formed so as to be larger than the width of the coil conductor layer 25 in the groove 112. Then, the conductive paste in the groove 112 is irradiated with ultraviolet rays or the like through the mask 110 and developed with a developing solution such as an alkaline solution to remove an unexposed portion 25a of the coil conductor layer 25. Thus, as illustrated in FIG. 5E, the coil conductor layer 25 is formed in the groove 112.

Figure 5F:
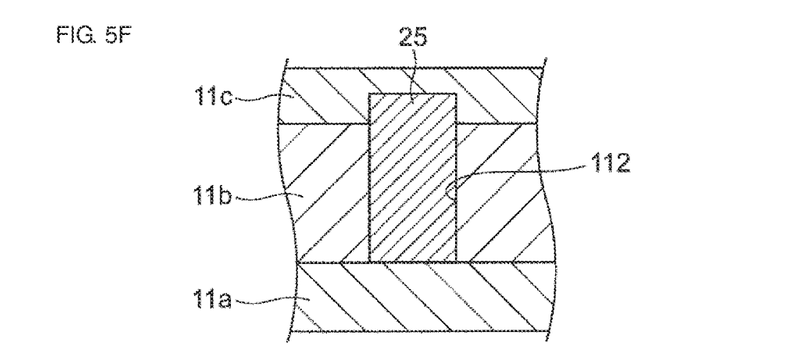
FIG. 5F is an explanatory diagram illustrating the method of manufacturing the inductor component.

As illustrated in FIG. 5F, the insulating paste is applied on the first insulating layer 11b and the coil conductor layer 25 to form a second insulating layer 11c. The above steps are repeated a plurality of times to form a multilayer body, and thereafter, firing is performed to manufacture the inductor component 1.

According to the manufacturing method of the inductor component 1, because the insulating paste including the filler material composed of quartz and the glass material is used, the refractive indexes of the filler material and the glass material can be approximated to each other. Consequently, this makes it possible to prevent scattering of light used for exposure in the first insulating layer 11b when the groove 112 is formed in the first insulating layer 11b by exposure so that light can be radiated to a deeper portion in the first insulating layer 11b. Therefore, it is possible to increase the aspect ratio of the coil conductor layer 25 and to increase the cross-sectional area of the coil conductor layer 25, and, as a result, it is possible to increase the current flowing through the coil 20 and to improve the coil characteristics.

In addition, the aspect ratio of the coil conductor layer 25 can be increased so that there is no need to stack the plurality of coil conductor layers 25 in surface contact with each other, the shape of the side surface 25a of the coil conductor layer 25 can be formed smoothly, and the coil characteristics can be improved.

The particle size of the quartz is about 0.1 µm or more and about 5 µm or less (i.e., from about 0.1 µm to about 5 µm). Preferably, the particle size of the quartz is about 0.9 µm. This is preferable because by making the particle size of the quartz about 0.1 µm or more, on the one hand, it becomes easier to disperse as insulating paste, whereas by making the particle size of the quartz about 5 µm or less, the change in refractive index is small and the shape of the groove 112 is hard to distort.

The absolute value of the difference in refractive index between the filler material and the glass material is preferably about 0.1 or less. Consequently, scattering of light used for exposure can be further prevented.

The particle size of the glass particles contained in the coil 20 is about 0.1 µm or more and about 5 µm or less (i.e., from about 0.1 µm to about 5 µm). Preferably, the particle size of the glass particles is about 0.9 µm. When the particle size of the glass particles is smaller than about 0.1 µm, dispersion of the conductive paste becomes difficult; on the other hand, when the particle size of the glass particles is larger than about 5 µm, the refractive index changes, and this is undesirable because the shape of the coil becomes distorted.

Preferably, in the exposure step, exposure is performed with light not including a wave length of about 350 nm or less using a filter or the like. Therefore, it is possible to cut a short wave length that easily scatters, and it is possible to more reliably form the groove 112 that is deep. For example, a filter or the like cuts the short wave length of a halogen lamp light source. Alternatively, a light source having a single wave length such as an LED may be used.

Preferably, firing is performed at a temperature of about 800° C. or more and about 1000° C. or less (i.e., from about 800° C. to about 1000° C.). Consequently, firing in which the glass material melts and the filler material does not melt can be performed.

Preferably, in the step of preparing the insulating paste and the conductive paste, the content ratio of the filler material to the glass material is about 20 vol % or more and about 50 vol % or less (i.e., from about 20 vol % to about 50 vol %). Therefore, a high aspect ratio and sinterability can be satisfied. On the other hand, if the content ratio of the filler material is too small, it becomes disadvantageous for a high aspect ratio, and if the content ratio of the filler material is too large, the sinterability deteriorates.

Embodiment of Inductor Component

In the embodiment of the inductor component, the W dimension of the inductor component is 200±10 µm, the L dimension of the inductor component is 400±10 µm, and the T dimension of the inductor component is 200 µm or more and 320 µm or less (i.e., from 200 µm to 320 µm). The depth of the groove is 20 µm, the width of the groove is 25 µm, and the thickness of the coil conductor layer is 25 µm. The number of turns of the coil is 1 to 10 turns.

In the existing example of the inductor component, the W dimension of the inductor component is 200±10 µm, the L dimension of the inductor component is 400±10 µm, and the T dimension of the inductor component is 200 µm or more and 320 µm or less (i.e., from 200 µm to 320 µm). The depth of the groove is 10 µm, the width of the groove is 25 µm, and the thickness of the coil conductor layer is 10 µm. The number of turns of the coil is 1 to 10 turns.

Then, when the Q value was measured under the condition that the measurement frequency was 6.1 GHz and the L value was 3.6 nH, the Q value of the existing example was 18, whereas the Q value of the embodiment was 24, and the Q value improved by 1.25 times or more.

Measurement Method of Refractive Index

A composition analysis method is used for measuring the refractive index. The cross section of the inductor component is polished to the center in the L direction, and composition analysis of the whole of the glass portion other than Ag is performed using EDX. From this result, the composition ratio is found and the refractive index is inferred. The range of the refractive index of glass is inferred from the correspondence table of the composition ratio of the glass and the refractive index.

Cross-sectional Area Ratio of Quartz Filler Material to Element Body

The cross section of the inductor component is polished to the center in the L direction, and the spherical quartz filler material is specified using EDX and SEM. The area ratio is calculated on the basis of the measurement area information. One hundred lines are drawn to measure the length of each quartz and borosilicate glass and average them.

Measurement Method of Particle Size of Quartz Filler Material

The cross section of the inductor component is polished to the center in the L direction and the maximum length of each of the undissolved fillers is measured. The filler is identified and the maximum length is measured. The average of ten pieces is found.

Second Embodiment

Figure 6:
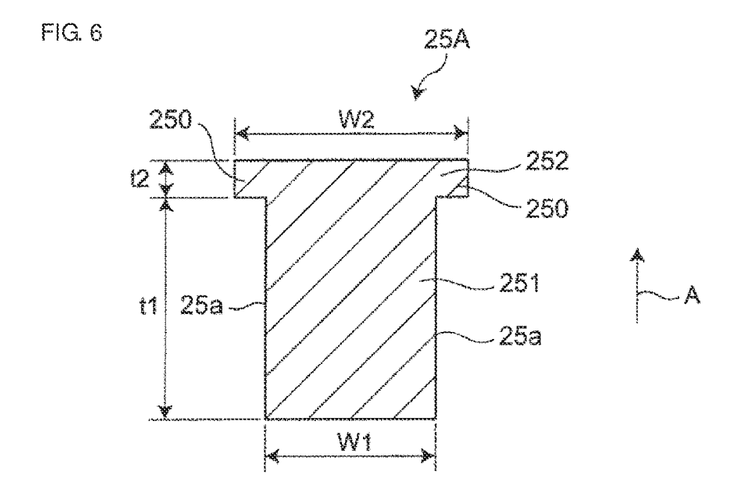
FIG. 6 is a cross-sectional view illustrating an inductor component according to a second embodiment of the present disclosure.

FIG. 6 is a cross-sectional view illustrating an inductor component according to a second embodiment of the present disclosure. The second embodiment is different from the first embodiment in terms of the configuration of the coil conductor layer. This different configuration will be described below.

Figure 7:
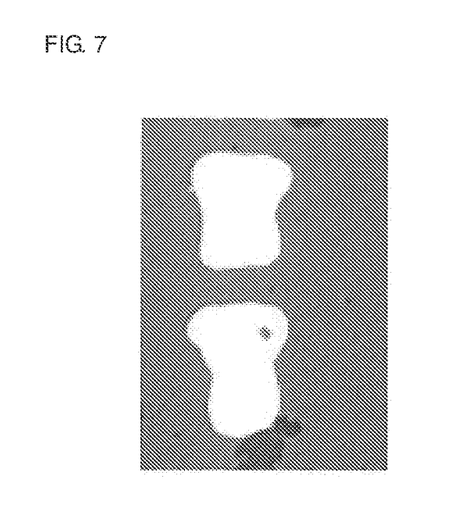
FIG. 7 is an image of a coil conductor layer.

As illustrated in FIG. 6, in the inductor component of the second embodiment, a coil conductor layer 25A in the cross section includes a body portion 251 and a head portion 252 connected to the body portion 251. FIG. 7 illustrates an image of the coil conductor layer 25A taken by an electron microscope.

The head portion 252 is positioned on the upper side in the stacking direction A of the body portion 251. The width w2 of the head portion 252 is larger than the width w1 of the body portion 251. The thickness t2 of a portion of the head portion 252 is smaller than the thickness t1 of the body portion 251. The thickness t2 of the head portion 252 is preferably about 30% or less of the total thickness.

Both side surfaces 25a of the coil conductor layer 25A each have one protrusion 250. That is, the protrusions 250 correspond to the end portions in the width direction of the head portion 252. The head portion 252 is formed by making the opening of the mask 110 larger than the opening of the groove 112 as illustrated in FIG. 5D. By increasing the opening of the mask 110 in this manner, the coil conductor layer 25A can be reliably formed even if the mask 110 is misaligned.

Therefore, the end portions in the width direction of the head portion 252 constitute the protrusions 250, but because the thickness t2 of the head portion 252 is small, it is possible to prevent deterioration of coil characteristics. In addition, the opening of the mask 110 can be enlarged for exposure so that the head portion 252 of the coil conductor layer 25A is formed and the coil conductor layer 25A can be reliably formed even if exposure deviation occurs. Further, the protrusion 250 may be provided only on one side surface 25a of the coil conductor layer 25A.

Further, the present disclosure is not limited to the above embodiments, and the design can be changed without departing from the gist of the present disclosure. For example, the characteristic points of each of the first and second embodiments may be combined in various ways.

In the above embodiment, a coloring material such as cobalt may be added to the element body to reduce the transmittance of the product, and the visibility of the internal coil can be reduced.

In the above embodiment, the outer electrodes are formed in a substantially L shape, but not limited thereto. The outer electrodes may be formed only on the bottom surface of the element body.

In the above embodiment, the coil has a configuration in which a plurality of coil conductor layers each having less than one turn are stacked; however, the number of turns of the coil conductor layer may be one or more. That is, the coil conductor layer may have a substantially planar spiral shape.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor component comprising:
    an element body formed by stacking a plurality of insulating layers, the insulating layers including a filler material composed of quartz and a glass material; and
    a coil provided in the element body, the coil including a coil conductor layer wound on each of the insulating layers,
    wherein
    an aspect ratio of the coil conductor layer is about 1.0 or more, and the aspect ratio is defined by a thickness of the coil conductor layer in a coil axis direction divided by a width of the coil conductor layer, and
    a side surface of the coil conductor layer has one protrusion or is smooth in a cross section perpendicular to a direction in which the coil conductor layer extends.

2. The inductor component according to claim 1,
    wherein the aspect ratio of the coil conductor layer is about 2.0 or less.

3. The inductor component according to claim 1,
    wherein, in the cross section, the coil conductor layer includes a body portion and a head portion connected to the body portion, a width of the head portion is larger than a width of the body portion, and a thickness of a portion of the head portion is smaller than a thickness of the body portion.

4. The inductor component according to claim 2,
    wherein, in the cross section, the coil conductor layer includes a body portion and a head portion connected to the body portion, a width of the head portion is larger than a width of the body portion, and a thickness of a portion of the head portion is smaller than a thickness of the body portion.

* * * * *